United States Patent
Kang et al.

(10) Patent No.: US 8,390,006 B2
(45) Date of Patent: Mar. 5, 2013

(54) LIGHT EMITTING DEVICE INCLUDING A PLURALITY OF GAN-BASED REFLECTIVE LAYERS

(75) Inventors: Dae Sung Kang, Seoul (KR); Myung Hoon Jung, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 12/948,423

(22) Filed: Nov. 17, 2010

(65) Prior Publication Data
US 2011/0186882 A1    Aug. 4, 2011

(30) Foreign Application Priority Data
Jan. 29, 2010 (KR) .................. 10-2010-0008573

(51) Int. Cl.
*H01L 21/66* (2006.01)
*H01L 33/00* (2010.01)

(52) U.S. Cl. ........... 257/94; 257/96; 257/97; 257/98; 257/103; 257/E33.025; 257/E33.049; 257/E33.072; 438/46; 438/47

(58) Field of Classification Search .......... 257/94, 257/96–98, 103, E33.025, E33.049, E33.072; 438/46, 47
See application file for complete search history.

(56) References Cited

U.S. PATENT DOCUMENTS 7,483,212 B2   1/2009  Cho et al.
2004/0173808 A1 *  9/2004  Wu ................................. 257/99
2006/0118799 A1 *  6/2006  D'Evelyn et al. ............... 257/96
2007/0145406 A1   6/2007  Han et al.
2009/0278144 A1  11/2009  Sonobe et al.
2009/0289316 A1  11/2009  Ishimura et al.
2010/0123118 A1 *  5/2010  Hu et al. ......................... 257/13
2010/0264440 A1  10/2010  Park

FOREIGN PATENT DOCUMENTS

| JP | 11-214744 A | 8/1999 |
| KR | 10-0665364 B1 | 12/2006 |
| KR | 10-2008-0017180 A | 2/2008 |
| KR | 10-2008-0070475 A | 7/2008 |
| KR | 10-2008-0070696 A | 7/2008 |

* cited by examiner

*Primary Examiner* — Kevin Parendo
(74) *Attorney, Agent, or Firm* — Birch, Stewart, Kolasch & Birch, LLP (57) ABSTRACT

Provided are a light emitting device, a method of manufacturing the light emitting device, a light emitting device package, and a lighting system. The light emitting device includes a reflective layer including a first GaN-based semiconductor layer having a first refractive index, a second GaN-based semiconductor layer having a second refractive index less than the first refractive index, and a third GaN-based semiconductor layer having a third refractive index less than the second refractive index and a light emitting structure layer including a first conductive type semiconductor layer, a second conductive type semiconductor layer, and an active layer disposed between the first conductive type semiconductor layer and the second conductive type semiconductor layer on the reflective layer.

20 Claims, 7 Drawing Sheets

LIGHT EMITTING DEVICE INCLUDING A PLURALITY OF GAN-BASED REFLECTIVE LAYERS

CROSS-REFERENCE TO RELATED APPLICATIONS

The present application claims priority of Korean Patent Application No. 10-2010-008573 filed on Jan. 29, 2010, which is hereby incorporated by reference in its entirety.

BACKGROUND

Embodiments relate to a light emitting device, a method of manufacturing the light emitting device, a light emitting device package, and a lighting system.

Recently, researches on devices using light emitting diodes (LEDs) as a device for emitting a light have been extensively carried out.

LEDs use the characteristics of a compound semiconductor to convert an electrical signal into a light. LEDs have a structure in which a first conductive type semiconductor layer, an active layer, and a second type conductive semiconductor layer are stacked. Here, a power source is applied to the structure to emit light from the active layer. The first conductive type semiconductor layer becomes an N-type semiconductor layer, and a second conductive type semiconductor layer becomes a P-type semiconductor layer. Here, the first and the second conductive semiconductor layer may become conductive type semiconductor layers opposite to each other.

A first electrode layer is disposed on the first conductive type semiconductor layer, and a second electrode layer is disposed on the second conductive type semiconductor layer.

In the light emitting device, a power source is applied to the first and second electrode layers to emit light from the active layer. Thus, researches in which it prevents the light emitted from the active layer from being absorbed within the light emitting device to improve light efficiency of the light emitting device are being widely carried out.

SUMMARY

Embodiments provide a light emitting device having a new structure, a method of manufacturing the light emitting device, a light emitting device package, and a lighting system.

Embodiments also provide a light emitting device having improved light efficiency, a method of manufacturing the light emitting device, a light emitting device package, and a lighting system.

In one embodiment, a light emitting device includes: a reflective layer including a first GaN-based semiconductor layer having a first refractive index, a second GaN-based semiconductor layer having a second refractive index less than the first refractive index, and a third GaN-based semiconductor layer having a third refractive index less than the second refractive index; and a light emitting structure layer including a first conductive type semiconductor layer, a second conductive type semiconductor layer, and an active layer disposed between the first conductive type semiconductor layer and the second conductive type semiconductor layer on the reflective layer.

In another embodiment, a method of manufacturing a light emitting device includes: alternately stacking a first GaN-based semiconductor layer having a first refractive index and a second GaN-based semiconductor layer having a second refractive index less than the first refractive index on a substrate; forming a mask layer on the second GaN-based semiconductor layer to selectively remove the first GaN-based semiconductor layer and the second GaN-based semiconductor layer; forming a reflective layer including alternately stacking the second GaN-based semiconductor layer and a third GaN-based semiconductor layer in a region in which the first GaN-based semiconductor layer and the second GaN-based semiconductor layer are selectively removed; and forming a light emitting structure layer including a first conductive type semiconductor layer, a second conductive type semiconductor layer, and an active layer disposed between the first conductive type semiconductor layer and the second conductive type semiconductor layer on the reflective layer.

The details of one or more embodiments are set forth in the accompanying drawings and the description below. Other features will be apparent from the description and drawings, and from the claims.

DETAILED DESCRIPTION OF THE EMBODIMENTS

In the descriptions of embodiments, it will be understood that when a layer (or film), a region, a pattern, or a structure is referred to as being 'on' a substrate, a layer (or film), a region, a pad, or patterns, it can be directly on another layer or substrate, or intervening layers may also be present. Further, it will be understood that when a layer is referred to as being 'under' another layer, it can be directly under another layer, and one or more intervening layers may also be present. Further, the reference about 'on' and 'under' each layer will be made on the basis of drawings.

In the drawings, the thickness or size of each layer is exaggerated, omitted, or schematically illustrated for convenience in description and clarity. Also, the size of each element does not entirely reflect an actual size.

Hereinafter, a light emitting device and a method of manufacturing the light emitting device according to embodiments will be described with reference to accompanying drawings.

Figure 1:
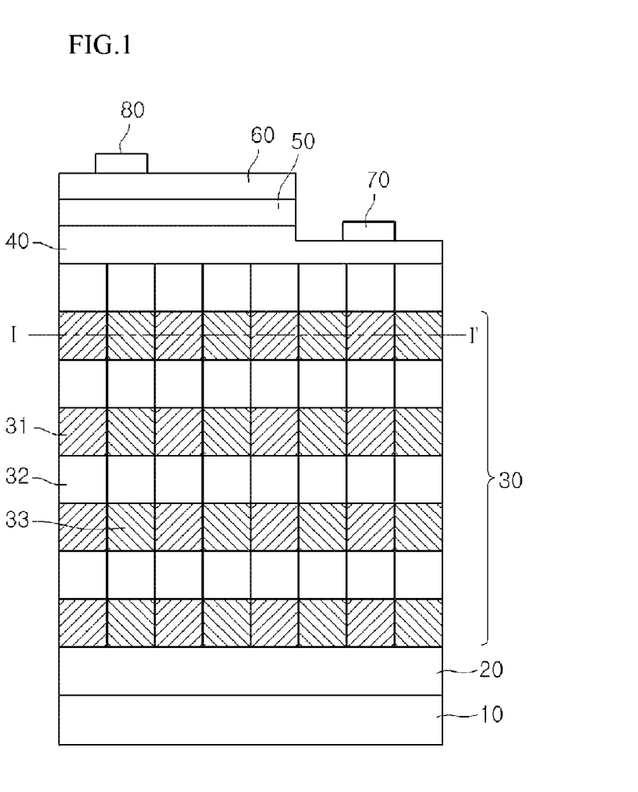
FIG. 1 is a view of a light emitting device according to a first embodiment.
Figure 2:
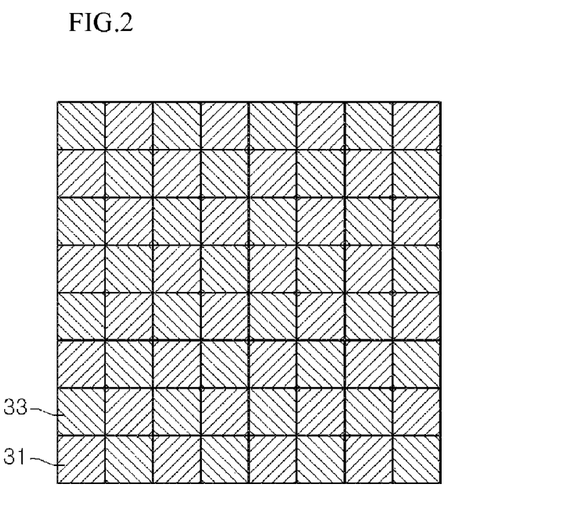
FIG. 2 is a view illustrating an example of a section taken along line I-I' of the light emitting device according to the first embodiment.
Figure 3:
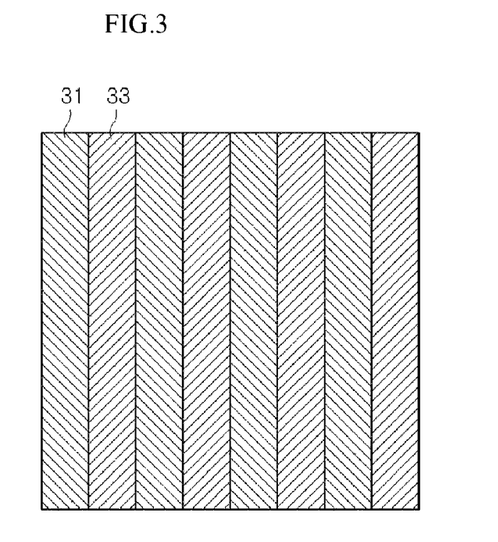
FIG. 3 is a view illustrating another example of a section taken along line I-I' of the light emitting device according to the first embodiment.

FIG. 1 is a view of a light emitting device according to a first embodiment. FIG. 2 is a view illustrating an example of a section taken along line I-I' of the light emitting device according to the first embodiment. FIG. 3 is a view illustrating another example of a section taken along line I-I' of the light emitting device according to the first embodiment.

Referring to FIG. 1, a light emitting device according to a first embodiment includes a substrate 10, a light emitting structure layer including a nitride semiconductor layer 20 on the substrate 10, a reflective layer 30 on the nitride semiconductor layer 20, a first conductive type semiconductor layer 40 on the reflective layer 30, an active layer 50, and a second conductive type semiconductor layer 60, a first electrode layer 70 on the first conductive type semiconductor layer 40, and a second electrode layer 80 on the second conductive type semiconductor layer 60.

For example, the substrate 10 may be formed of at least one of sapphire ($Al_2O_3$), SiC, GaAs, GaN, ZnO, Si, GaP, InP, and Ge, but is not limited thereto. For example, the substrate 10 may include a sapphire substrate on which the light emitting structure layer is grown. A plurality of protrusion patterns may be disposed on a top surface of the substrate 10. The protrusion patterns may disperse light emitted from the active layer 50 to improve light efficiency. For example, each of the protrusion patterns may have one of a hemisphere shape, a polygonal shape, a pyramid shape, and a nano pillar shape.

The nitride semiconductor layer 20 may include at least one of a buffer layer, an un-doped nitride layer and a nitride layer containing a first conductive type impurity.

The buffer layer may have one of stacked structures of an AlInN/GaN structure, an $In_xGa_{1-x}N$/GaN structure, and an $Al_xIn_yGa_{1-(x+y)}N$/$In_xGa_{1-x}N$/GaN structure. The un-doped nitride layer may be formed of a GaN-based semiconductor layer, and the nitride layer containing the first conductive type impurity may be formed of a GaN-based semiconductor layer containing an n-type impurity. Also, the nitride semiconductor layer 20 may not be formed according to a design of the light emitting device.

The reflective layer 30 may include a first GaN-based semiconductor layer 31 having a first refractive index, a second GaN-based semiconductor layer 32 having a second refractive index less than the first refractive index, and a third GaN-based semiconductor layer 33 having a third refractive index less than the second refractive index.

For example, the first GaN-based semiconductor layer 31 may be formed of an InGaN layer having a refractive index of about 2.3, the second GaN-based semiconductor layer 32 may be formed of a GaN layer having a refractive index of about 2.2, and the third GaN-based semiconductor layer 33 may be formed of an AlGaN layer having a refractive index of about 2.1. In addition, the first GaN-based semiconductor layer 31, the second GaN-based semiconductor layer 32, and the third GaN-based semiconductor layer 33 may contain the first conductive type impurity.

Since the reflective layer 30 includes at least three layers having refractive indexes different from each other, light emitted from the active layer 50 to proceed toward the substrate 10 may be effectively reflected by the reflective layer 30 to improve light efficiency of the light emitting device.

That is, in the reflective layer 30, layers having refractive indexes different from each other may be alternately disposed in a vertical direction to improve a vertical reflectance. In addition, layers having refractive indexes difference from each other may be alternately disposed in a horizontal direction to improve a horizontal reflectance. Thus, the reflective layer 30 has a superior reflectance with respect to light proceeding vertically from the active layer 50 toward a lower side and light proceeding inclinedly from the active layer 50 toward the lower side.

The reflective layer 30 may serve as a distributed bragg reflector (DBR) in the vertical and horizontal directions. Thus, it may be advantageous that the first GaN-based semiconductor layer 31, the second GaN-based semiconductor layer 32, and the third GaN-based semiconductor layer 33 are formed of materials having high reflectance differences therebetween.

For example, each of the first GaN-based semiconductor layer 31, the second GaN-based semiconductor layer 32, and the third-based semiconductor layer 33 may have a thickness of about 40 nm to about 60 nm, and more particularly, a thickness of about nm to about 50 nm. Also, each of the first GaN-based semiconductor layer 31, the second GaN-based semiconductor layer 32, and the third-based semiconductor layer 33 may have a width of about 40 nm to about 50 μm. Since the first GaN-based semiconductor layer 31, the second GaN-based semiconductor layer 32, and the third-based semiconductor layer 33 have the foregoing thickness or widths, the reflectance may be further improved.

According to the first embodiment, the first GaN-based semiconductor layer 31 and the second GaN-based semiconductor layer 32 are alternately stacked in the vertical direction in a portion region of the reflective layer 30.

Also, the second GaN-based semiconductor layer 32 and the third GaN-based semiconductor layer 33 are alternately stacked in the vertical direction in the other region of the reflective layer 30.

Also, the first GaN-based semiconductor layer 31 and the third GaN-based semiconductor layer 33 are alternately disposed in the horizontal direction in a portion region of the reflective layer 30.

Also, the second GaN-based semiconductor layer 32 is horizontally disposed in the other region of the reflective layer 30.

FIGS. 2 and 3 are sectional views taken along line I-I' of FIG. 1 when viewed from an upper side.

As shown in FIG. 2, the first GaN-based semiconductor layer 31 and the third GaN-based semiconductor layer 33 may be disposed in a lattice shape. Also, as shown in FIG. 3, the first GaN-based semiconductor layer 31 and the third GaN-based semiconductor layer 33 may be alternately disposed in a strip shape.

Here, the forms of the semiconductor layers illustrated in FIGS. 2 and 3 are just examples. The first GaN-base semiconductor layer 31 and the third GaN-based semiconductor layer 33 may be disposed in various shapes such as a structure in which the first GaN-base semiconductor layer 31 and the third GaN-based semiconductor layer 33 are flush with each other.

The light emitting structure layer may be formed of a GaN-based semiconductor layer. The light emitting structure may be designed with various structures. However, in the current embodiment, a structure in which the light emitting structure layer includes the first conductive type semiconductor layer 40, the active layer 50, and the second conductive type semiconductor layer 60 is illustrated as an example.

For example, the first conductive type semiconductor layer 40 may include an n-type semiconductor layer. The first conductive type semiconductor layer 40 may be formed of a semiconductor material having a compositional formula of $In_xAl_yGa_{1-x-y}N$ ($0 \leq x \leq 1$, $0 \leq y \leq 1$, $0 \leq x+y \leq 1$), e.g., one of InAlGaN, GaN, AlGaN, AlInN, InGaN, AlN, and InN. Here, the n-type semiconductor layer is doped with an n-type dopant such as Si, Ge, or Sn.

The active layer 50 is a layer in which electrons (or holes) injected through the first conductive type semiconductor layer 40 and holes (or electrons) injected through the second conductive type semiconductor layer 60 may be recombined to emit light by a band gap difference of an energy band depending on a formation material of the active layer 50.

The active layer 50 may have one of a single quantum well structure, a multi quantum well (MQW) structure, a quantum dot structure, and a quantum wire structure, but is not limited thereto.

The active layer 50 may be formed of a semiconductor material having a compositional formula of $In_xAl_yGa_{1-x-y}N$ ($0 \leq x \leq 1$, $0 \leq y \leq 1$, $0 \leq x+y \leq 1$). When the active layer 50 has the MQW structure, the active layer 50 may include a plurality of well layers and a plurality of barrier layers, which are stacked on each other. For example, the active layer 50 may be formed at a cycle of an InGaN well layer/GaN barrier layer.

A doped clad layer (not shown) in which an n-type or p-type dopant is doped may be disposed on/under the active layer 50. The clad layer (not shown) may be realized by an AlGaN layer or an InAlGaN layer.

For example, the second conductive type semiconductor layer 60 may be realized by a p-type semiconductor layer. The second conductive type semiconductor layer 60 may be formed of a semiconductor material having a compositional formula of $In_xAl_yGa_{1-x-y}N$ ($0 \leq x \leq 1$, $0 \leq y \leq 1$, $0 \leq x+y \leq 1$), e.g., one of InAlGaN, GaN, AlGaN, InGaN, AlInN, AlN, and InN. Also, the p-type semiconductor layer may be doped with the p-type dopant such as Mg, Zn, Ca, Sr, or Ba.

The first conductive type semiconductor layer 40 may include the p-type semiconductor layer, and the second conductive type semiconductor layer 60 may include the n-type semiconductor layer. Also, a third conductive type semiconductor layer (not shown) including an n-type or p-type semiconductor layer may be disposed on the second conductive type semiconductor layer 60. Thus, the light emitting structure layer may have at least one of an np junction structure, a pn junction structure, an npn junction structure, and a pnp junction structure. Also, impurities may be uniformly or non-uniformly doped into the first and second conductive type semiconductor layers 40 and 60. Thus, the light emitting structure layer may have various structures, but is not limited thereto.

The first electrode layer 70 is disposed on the first conductive type semiconductor layer 40, and the second electrode layer 80 is disposed on the second conductive type semiconductor layer 60 to respectively supply a power to the active layer 50. An ohmic contact layer for reducing a resistance may be disposed between the second conductive type semiconductor layer 60 and the second electrode layer 80.

The light emitting device may be a GaN-based light emitting diode, which emits blue light having a wavelength region of about 45 nm to about 480 nm, particularly, having a centroid wavelength in a wavelength region of about 465 nm and having a full width at half maximum of about 15 nm to about 40 nm.

Figure 4:
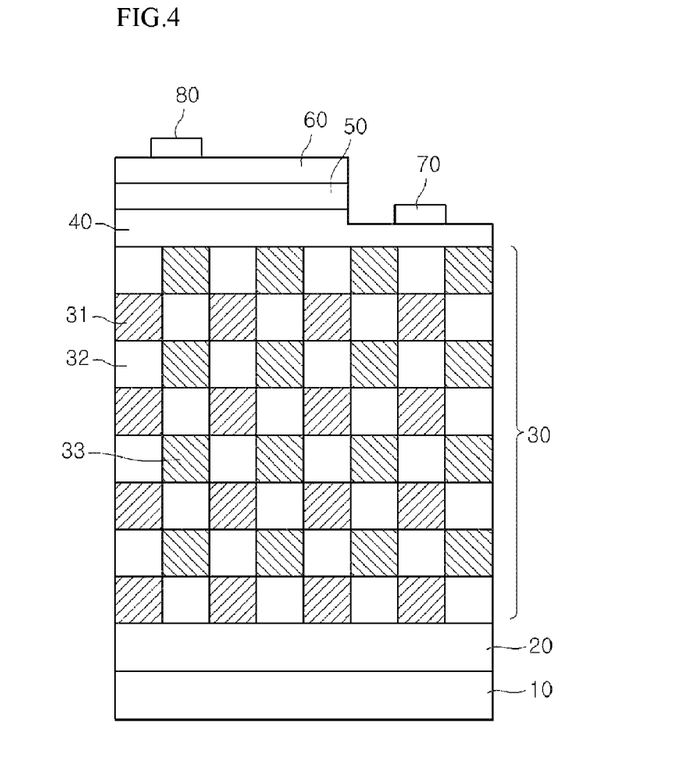
FIG. 4 is a view of a light emitting device according to a second embodiment.

FIG. 4 is a view of a light emitting device according to a second embodiment.

Referring to FIG. 4, a light emitting device according to a second embodiment has the same structure as that of the light emitting device according to the first embodiment except a structure of a reflective layer. Thus, only the structure of the reflective layer will be described below.

In the light emitting device according to the second embodiment, the reflective layer 30 may include a first GaN-based semiconductor layer 31 having a first refractive index, a second GaN-based semiconductor layer 32 having a second refractive index less than the first refractive index, and a third GaN-based semiconductor layer 33 having a third refractive index less than the second refractive index.

For example, the first GaN-based semiconductor layer 31 may be formed of an InGaN layer having a refractive index of about 2.3, the second GaN-based semiconductor layer 32 may be formed of a GaN layer having a refractive index of about 2.2, and the third GaN-based semiconductor layer 33 may be formed of an AlGaN layer having a refractive index of about 2.1.

Since the reflective layer 30 includes at least three layers having refractive indexes different from each other, light emitted from the active layer 50 to proceed toward the substrate 10 may be effectively reflected by the reflective layer 30 to improve light efficiency of the light emitting device.

That is, in the reflective layer 30, layers having refractive indexes different from each other may be alternately disposed in a vertical direction to improve a reflectance. In addition, layers having refractive indexes difference from each other may be alternately disposed in a horizontal direction to improve a reflectance. Thus, the reflective layer 30 has a superior reflectance with respect to light proceeding vertically from the active layer 50 toward a lower side and light proceeding inclinedly from the active layer 50 toward the lower side.

The reflective layer 30 may serve as a distributed bragg reflector (DBR) in the vertical and horizontal directions. Thus, it may be advantageous that the first GaN-based semiconductor layer 31, the second GaN-based semiconductor layer 32, and the third GaN-based semiconductor layer 33 are formed of materials having high reflectance differences therebetween.

According to the second embodiment, the first GaN-based semiconductor layer 31 and the second GaN-based semiconductor layer 32 are alternately stacked in the vertical direction in a portion region of the reflective layer 30.

Also, the second GaN-based semiconductor layer 32 and the third GaN-based semiconductor layer 33 are alternately stacked in the vertical direction in the other region of the reflective layer 30.

Also, the first GaN-based semiconductor layer 31 and the third GaN-based semiconductor layer 33 are alternately disposed in the horizontal direction in a portion region of the reflective layer 30.

Also, the second GaN-based semiconductor layer 32 and the third GaN-based semiconductor layer 33 are horizontally disposed in the other region of the reflective layer 30.

Similar to that of FIG. 2, the first GaN-based semiconductor layer 31 and the second GaN-based semiconductor layer 32 may be disposed in a lattice shape. Also, the second GaN-based semiconductor layer 32 and the third GaN-based semiconductor layer 33 may be disposed in a lattice shape. Alternatively, similar to that of FIG. 3, the first GaN-based semiconductor layer 31 and the second GaN-based semiconductor layer 32 may be alternately disposed in a strip shape, and the second GaN-based semiconductor layer 32 and the third GaN-based semiconductor layer 33 may be alternately disposed in a strip shape.

FIGS. 5 to 9 are views for explaining a process of manufacturing a light emitting device according to embodiments.

Figure 5:
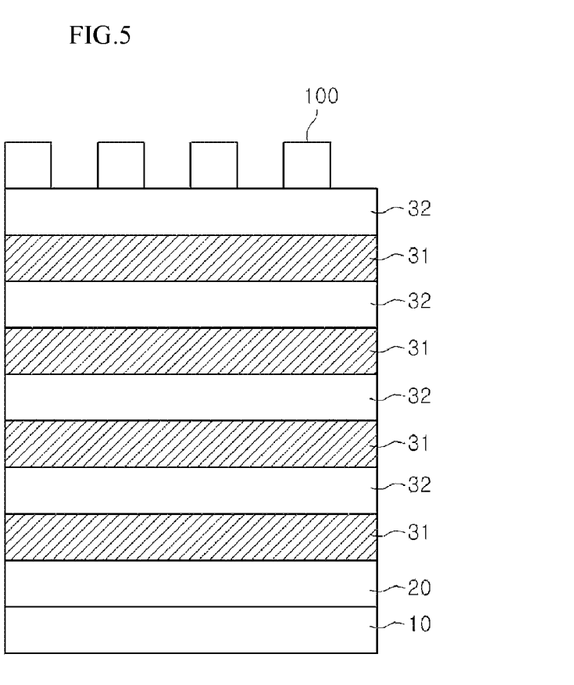
FIGS. 5 to 9 are views for explaining a process of manufacturing a light emitting device according to embodiments.

Referring to FIG. 5, a substrate 10 is prepared. A nitride semiconductor layer 20 is formed on the substrate 10.

A first GaN-based semiconductor layer 31 and a second GaN-based semiconductor layer 32 are alternately stacked on the nitride semiconductor layer 20. The first GaN-based semiconductor layer 31 may be formed of an InGaN layer, and the second GaN-based semiconductor layer 32 may be formed of a GaN layer. A plurality of pairs of the first GaN-based semiconductor layer 31 and the second GaN-based semiconductor layer 32 may be repeatedly stacked, for example, 10 pairs or more of the first GaN-based semiconductor layer 31 and the second GaN-based semiconductor layer 32 may be repeatedly stacked.

Also, a mask layer 100 is formed on the second GaN-based semiconductor layer 32. The mask layer 100 may be formed of a silicon oxide layer ($SiO_2$).

Figure 6:
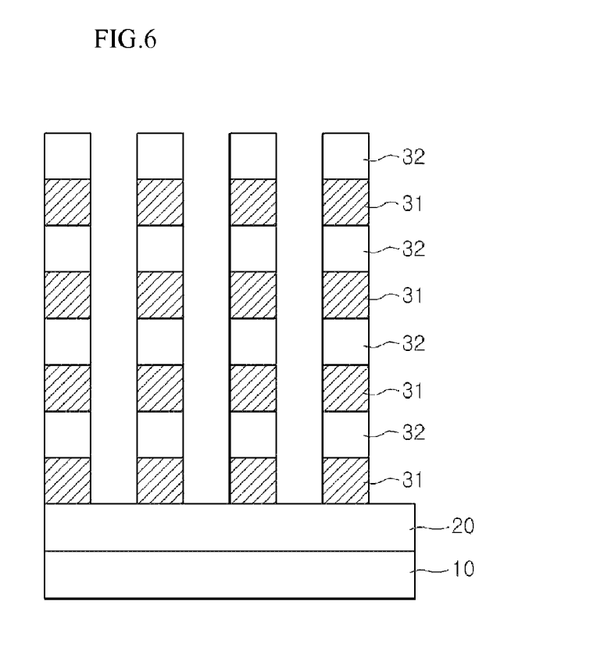

Referring to FIG. 6, the first GaN-based semiconductor layer 31 and the second GaN-based semiconductor layer 32 are selectively etched using the mask layer 100 as a mask.

Figure 7:
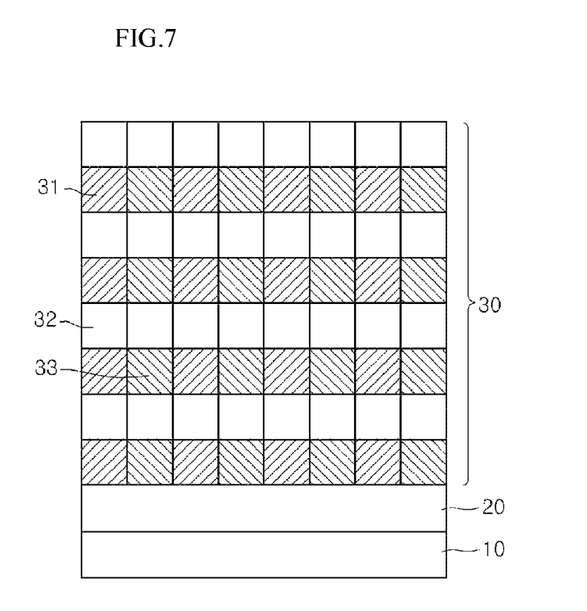

Referring to FIG. 7, a plurality of pairs of a third GaN-based semiconductor layer 33 and the second GaN-based semiconductor layer 32 is repeatedly stacked in a region in which the first GaN-based semiconductor layer 31 and the second GaN-based semiconductor layer 32 are selectively etched to form a reflective layer 30. The third GaN-based semiconductor layer 33 may be formed of an AlGaN layer.

Although the third GaN-based semiconductor layer 32 is firstly formed to allow the first GaN-based semiconductor layer and the third GaN-based semiconductor layer 33 to be horizontally disposed in FIG. 7, like the light emitting device according to the first embodiment, the second GaN-based semiconductor layer 32 may be firstly formed to allow the first GaN-based semiconductor layer 31 and the second GaN-based semiconductor layer 32 to be horizontally disposed, like the light emitting device according to the second embodiment.

Figure 8:
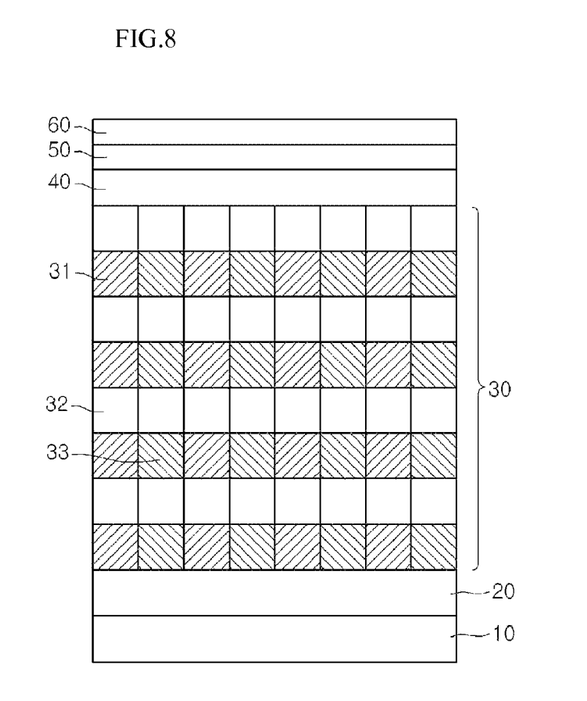

Referring to FIG. 8, a light emitting structure layer including a first conductive type semiconductor layer 40, an active layer 50, and a second conductive type semiconductor layer 60 is formed on the reflective layer 30.

Figure 9:
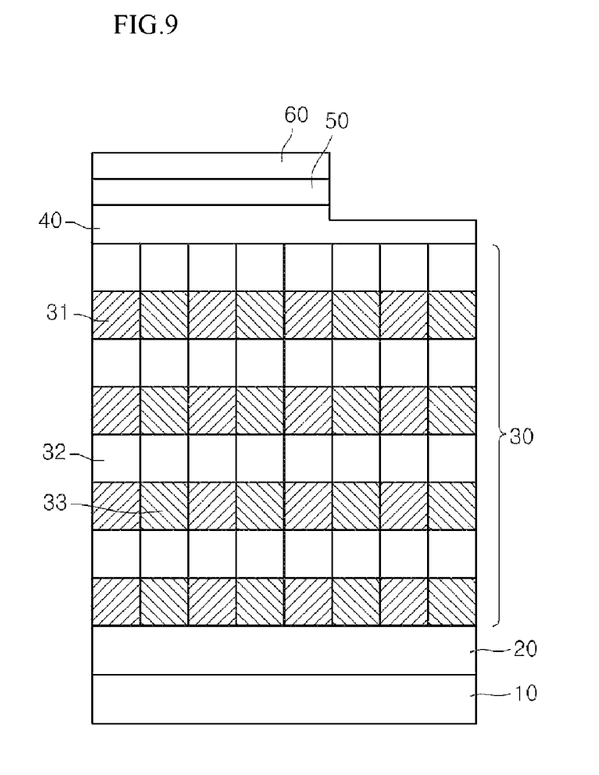

Referring to FIG. 9, a mesa etching process is performed to partially remove the second conductive type semiconductor layer 60, the active layer 50, and the first conductive type semiconductor layer 40. Thus, the mesa etching process is performed to upwardly expose a portion of the first conductive type semiconductor layer 40.

As shown in FIG. 1, a first electrode layer 70 is formed on the first conductive type semiconductor layer 40, and a second electrode layer 80 is formed on the second conductive type semiconductor layer 60. Thus, the light emitting device according to the embodiments will be manufactured.

In the light emitting device according to the embodiments and the method of manufacturing the same, the reflective layer 30 is formed using the first GaN-based semiconductor layer 31, the second GaN-based semiconductor layer 32, and the third GaN-based semiconductor layer 33. Here, the first GaN-based semiconductor layer may be an InGaN layer, the second GaN-based semiconductor layer 32 may be a GaN layer, and the third GaN-based semiconductor layer 33 may be an AlGaN layer.

When the InGaN layer and the AlGaN layer are vertically stacked to form the reflective layer, defects due to a lattice constant difference therebetween may occur. Thus, since the reflective layer should be grown under nitrogen atmosphere and hydrogen atmosphere, it is difficult to perform a process of forming the reflective layer. However, according to the light emitting device according to the embodiments and the method of manufacturing the same, since the reflective layer is formed without vertically stacking the InGaN layer and the AlGaN layer, there is an advantage in that the defects due to the lattice constant difference therebetween do not occur.

Figure 10:
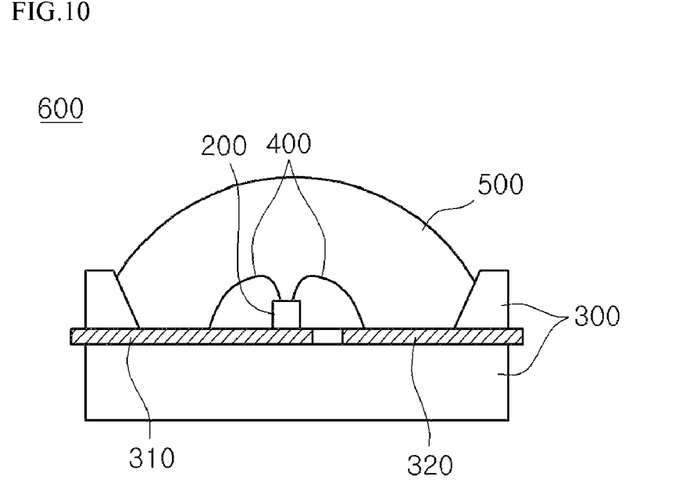
FIG. 10 is a view of a light emitting device package including a light emitting device according to embodiments.

FIG. 10 is a view of a light emitting device package including a light emitting device according to embodiments.

Referring to FIG. 10, a light emitting device package 600 according to an embodiment includes a package body 300, first and second electrodes 310 and 320 disposed on the package body 300, a light emitting device 200 disposed on the package body 300 and electrically connected to the first and second electrodes 310 and 320, and a molding member 500 surrounding the light emitting device 200 on the package body 300.

The package body 300 may be formed of a silicon material, a synthetic resin material, or a metal material. Also, an inclined surface may be disposed around the light emitting device 200.

The first electrode 310 and the second electrode 320 are electrically separated from each other and provide a power the light emitting device 200. Also, the first and second electrodes 310 and 320 may reflect light emitted from the light emitting device 200 to improve light efficiency. Also, heat generated in the light emitting device 200 may be discharged to the outside through the first and second electrodes 310 and 320.

The light emitting device 200 may be disposed on the package body 300 or the first and second electrodes 310 and 320.

The light emitting device 200 may be electrically connected to the first and second electrodes 310 and 320 through a wire 400.

The molding member 500 may surround the light emitting device 200 to protect the light emitting device 200. Also, a phosphor may be contained in the molding member 500 to change a wavelength of the light emitted from the light emitting device 200.

Since the light emitting device 200 having superior light efficiency is applied to the light emitting device package 600, the light emitting device package 600 may have superior light efficiency.

A plurality of light emitting device packages 600 according to an embodiment is arrayed on the substrate. Also, optical members such as a light guide plate, a prism sheet, a diffusion sheet, and a fluorescence sheet may be disposed on a path of the light emitted from the light emitting device package 600. The light emitting device package 600, the substrate, and the optical members may function as a backlight unit or a lighting unit. For example, a lighting system may include the backlight unit, the lighting unit, an indication device, a lamp, and a street lamp.

Figure 11:
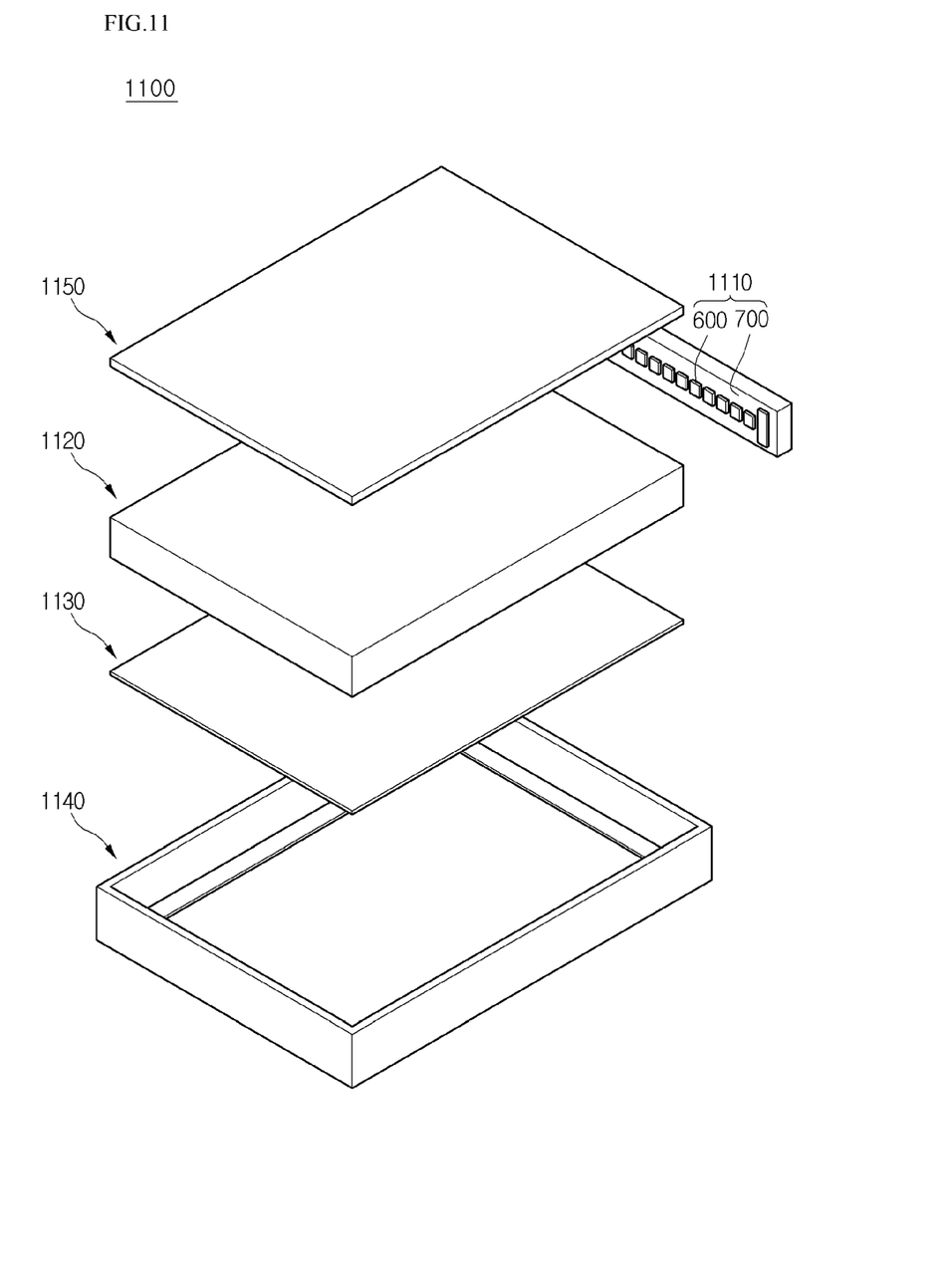
FIG. 11 is a view of a backlight unit using a light emitting device or a light emitting device package according to an embodiment.

FIG. 11 is a view of a backlight unit using a light emitting device or a light emitting device package according to an embodiment. However, the backlight unit 1100 of FIG. 11 is described an example of the lighting system, the present disclosure is not limited thereto.

Referring to FIG. 11, the backlight unit 1100 may include a bottom frame 1140, a light guide member 1120 disposed within the bottom frame 1140, and a light emitting module 1110 disposed on at least one side or an under surface of the light guide member 1120. Also, a reflective sheet 1130 may be disposed under the light guide member 1120.

The bottom frame 1140 may have a box shape with an opened upper side to receive the light guide member 1120, the light emitting module 1110, and the reflective sheet 1130. The bottom frame 1140 may be formed of a metal material or a resin material, but is not limited thereto.

The light emitting module 1110 may include a substrate 700 and a plurality of light emitting device packages 600 mounted on the substrate 700. The plurality of light emitting device packages 600 may provide light to the light guide member 1120. Although the light emitting package 600 is disposed on the substrate 700 in the light emitting module 1110 according to an embodiment, the light emitting device 200 according to an embodiment may be directly disposed on the substrate 700.

As shown in FIG. 11, the light emitting module 1110 may be disposed on at least one of inner surfaces of the bottom frame 1140. Thus, the light emitting module 1110 may provide light toward at least one lateral surface of the light guide member 1120.

The light emitting module 1110 may be disposed under the bottom frame 1140 to provide light toward the under surface of the light guide member 1120. This may be variously varied according to a design of the backlight unit 1100, but is not limited thereto.

The light guide member 1120 may be disposed within the bottom frame 1140. The light guide member 1120 may receive the light provided from the light emitting module 1110 to produce planar light, and then guide the planar light to a display panel (not shown).

For example, the light guide member 1120 may be a light guide panel (LGP). The LGP may be formed of one of a resin-based material such as polymethylmethacrylate (PMMA), a polyethylene terephthalate (PET) resin, a poly carbonate (PC) resin, a cyclic olefin copolymer (COC) resin, and a polyethylene naphthalate (PEN) resin.

An optical sheet 1150 may be disposed on the light guide member 1120.

For example, the optical sheet 1150 may include at least one of a diffusion sheet, a light collection sheet, a brightness enhancement sheet, and a fluorescence sheet. For example, the diffusion sheet, the light collection sheet, the brightness enhancement sheet, and the fluorescence sheet may be stacked to form the optical sheet 1150. In this case, the diffusion sheet 1150 may uniformly diffuse light emitted from the light emitting module 1110, and the diffused light may be collected into the display panel (not shown) by the light collection sheet. Here, the light emitted from the light collection sheet is randomly polarized light. The bright enhancement sheet may enhance a degree of polarization of the light emitted from the light collection sheet. For example, the light collection sheet may be a horizontal and/or vertical prism sheet. Also, the bright enhancement sheet may be a dual brightness enhancement film. The fluorescence sheet may be a light transmitting plate or film including a phosphor.

The reflective sheet 1130 may be disposed under the light guide member 1120. The reflective sheet 1130 reflects the light emitted through the under surface of the light guide member 1120 toward a light emitting surface of the light guide member 1120.

The reflective sheet may be formed of a material having superior reflectance, e.g., a PET resin, a PC resin, or a PVC resin, but is not limited thereto.

Figure 12:
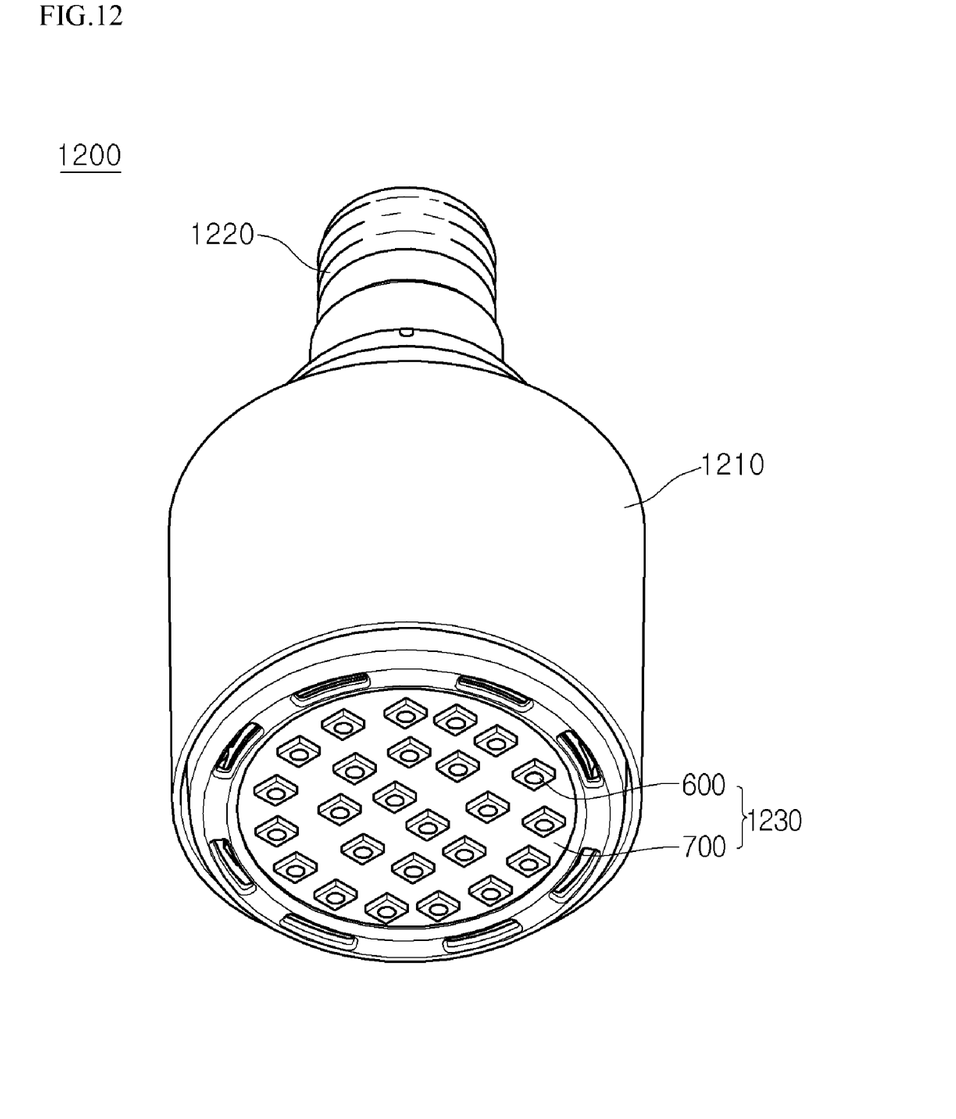
FIG. 12 is a view of a lighting unit using a light emitting device or a light emitting device package according to an embodiment.

FIG. 12 is a view of a lighting unit using a light emitting device or a light emitting device package according to an embodiment. However, the lighting unit 1200 of FIG. 14 is described an example of the lighting system, the present disclosure is not limited thereto.

Referring to FIG. 12, the lighting unit 1200 may include a case body 1210, a light emitting module 1230 disposed on the case body 1210, a connection terminal 1220 disposed on the case body 1210 to receive a power from an external power source.

The case body 1210 may be formed of a material having good thermal dissipation properties, e.g., a metal material or a resin material.

The light emitting module 1230 may include a substrate 700 and at least one light emitting device package 600 mounted on the substrate 700. Although the light emitting device package 600 is disposed on the substrate 700 in the light emitting module 1110 according to an embodiment, the light emitting device 200 according to an embodiment may be directly disposed on the substrate 700.

A circuit pattern may be printed on a dielectric to form the substrate 700. For example, the substrate 700 may include a printed circuit board (PCB), a metal core PCB, a flexible PCB, and a ceramic PCB.

Also, the substrate 700 may be formed of an effectively reflective material or have a color on which light is effectively reflected from a surface thereof, e.g., a white color or a silver color.

At least one light emitting device package 600 may be mounted on the substrate 700. The light emitting device package 600 may include at least one light emitting diode (LED). The LED may include colored LEDs, which respectively emit light having a red color, a green color, a blue color, and a white color and an ultraviolet (UV) LED emitting UV rays.

The light emitting module 1230 may have various combinations of the LED to obtain color impression and brightness. For example, the white LED, the red LED, and the green LED may be combined with each other to secure a high color rendering index. Also, a fluorescence sheet may be further disposed on a path of light emitted from the light emitting module 1230. The fluorescence sheet changes a wavelength of the light emitted from the light emitting module 1230. For example, when the light emitted from the light emitting module 1230 has a blue wavelength band, the fluorescence sheet may include a yellow phosphor. Thus, the light emitted from the light emitting module 1230 passes through the fluorescence sheet to finally emit white light.

The connection terminal 1220 may be electrically connected to the light emitting module 1230 to provide a power to the light emitting module 1230. Referring to FIG. 14, the connected terminal 1220 is screw-coupled to an external power source in a socket manner, but is not limited thereto. For example, the connection terminal 1220 may have a pin shape, and thus, be inserted into the external power source. Alternatively, the connection terminal 1220 may be connected to the external power source by a wire.

As described above, in the lighting system, at least one of the light guide member, the diffusion sheet, the light collection sheet, the brightness enhancement sheet, and the fluorescence sheet may be disposed on the path of the light emitted from the light emitting module to obtain a desired optical effect.

As described above, since the lighting system includes the light emitting device or the light emitting device package having the superior light efficiency according to an embodiment, the lighting system may have superior light efficiency.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device, comprising:
    a reflective layer comprising a first GaN-based semiconductor layer having a first refractive index, a second GaN-based semiconductor layer having a second refractive index less than the first refractive index, and a third GaN-based semiconductor layer having a third refractive index less than the second refractive index; and
    a light emitting structure layer comprising a first conductive type semiconductor layer, a second conductive type semiconductor layer, and an active layer disposed between the first conductive type semiconductor layer and the second conductive type semiconductor layer on the reflective layer,
    wherein the first GaN-based semiconductor layer and the second GaN-based semiconductor layer are alternately stacked in a vertical direction in a first region of the reflective layer, and the second GaN-based semiconductor layer and the third GaN-based semiconductor layer are alternately stacked in the vertical direction in a second region of the reflective layer,
    wherein the reflective layer comprises a plurality of layers including at least two layers from the first GaN-based semiconductor layer, the second GaN-based semiconductor layer and the third GaN-based semiconductor layer, and
    wherein at least two of the first GaN-based semiconductor layer, the second GaN-based semiconductor layer, and the third GaN-based semiconductor layer are alternately disposed in a horizontal direction perpendicular to the vertical direction.

2. The light emitting device of claim 1, wherein the first GaN-based semiconductor layer and the third GaN-based semiconductor layer are alternately disposed in the horizontal direction in a third region of the reflective layer, and the second GaN-based semiconductor layer is disposed in a fourth region of the reflective layer.

3. The light emitting device of claim 2, wherein the first GaN-based semiconductor layer and the third GaN-based semiconductor layer are disposed along the horizontal direction in a lattice shape.

4. The light emitting device of claim 2, wherein the first GaN-based semiconductor layer and the third GaN-based semiconductor layer are disposed along the horizontal direction in a strip shape.

5. The light emitting device of claim 1, wherein the first GaN-based semiconductor layer and the second GaN-based semiconductor layer are alternately disposed in the horizontal direction in a third region of the reflective layer, and the second GaN-based semiconductor layer and the third GaN-based semiconductor layer are alternately disposed horizontally in a fourth region of the reflective layer.

6. The light emitting device of claim 5, wherein the first GaN-based semiconductor layer and the second GaN-based semiconductor layer are horizontally disposed in a lattice shape, and the second GaN-based semiconductor layer and the third GaN-based semiconductor layer are horizontally disposed in the lattice shape.

7. The light emitting device of claim 5, wherein the first GaN-based semiconductor layer and the second GaN-based semiconductor layer are horizontally disposed in a strip shape, and the second GaN-based semiconductor layer and the third GaN-based semiconductor layer are horizontally disposed in the strip shape.

8. The light emitting device of claim 1, wherein the first GaN-based semiconductor layer comprises an InGaN layer, the second GaN-based semiconductor layer comprises a GaN layer, and the third GaN-based semiconductor layer comprises an AlGaN layer.

9. The light emitting device of claim 1, further comprising a nitride semiconductor layer and a substrate, which are disposed under the reflective layer.

10. The light emitting device of claim 1, further comprising a first electrode layer on the first conductive type semiconductor layer and a second electrode layer on the second conductive type semiconductor layer.

11. The light emitting device of claim 1, wherein each of the first GaN-based semiconductor layer, the second GaN-based semiconductor layer, and the third GaN-based semiconductor layer has a thickness of about 40 nm to about 60 nm.

12. The light emitting device of claim 1, wherein each of the first GaN-based semiconductor layer, the second GaN-based semiconductor layer, and the third GaN-based semiconductor layer has a width of about 40 nm to about 50 μm.

13. A light emitting device, comprising:
    a reflective layer comprising a first GaN-based semiconductor layer having a first refractive index, a second GaN-based semiconductor layer having a second refractive index less than the first refractive index, and a third GaN-based semiconductor layer having a third refractive index less than the second refractive index; and
    a light emitting structure layer comprising a first conductive type semiconductor layer, a second conductive type semiconductor layer, and an active layer disposed between the first conductive type semiconductor layer and the second conductive type semiconductor layer on the reflective layer,
    wherein the first conductive type semiconductor layer, the active layer, and the second conductive type semiconductor layer are stacked in a vertical direction, and
    wherein the first GaN-based semiconductor layer and the second GaN-based semiconductor layer are alternately disposed in a horizontal direction perpendicular to the vertical direction in a third region of the reflective layer, and the second GaN-based semiconductor layer and the third GaN-based semiconductor layer are alternately disposed in the horizontal direction perpendicular to the vertical direction in a fourth region of the reflective layer.

14. The light emitting device of claim 13, wherein the first GaN-based semiconductor layer and the second GaN-based semiconductor layer are disposed along the horizontal direction in a lattice shape, and the second GaN-based semiconductor layer and the third GaN-based semiconductor layer are disposed along the horizontal direction in the lattice shape.

15. The light emitting device of claim 13, wherein the first GaN-based semiconductor layer comprises an InGaN layer, the second GaN-based semiconductor layer comprises a GaN layer, and the third GaN-based semiconductor layer comprises an AlGaN layer.

16. The light emitting device of claim 13, further comprising a nitride semiconductor layer and a substrate, which are disposed under the reflective layer.

17. The light emitting device of claim 13, further comprising a first electrode layer on the first conductive type semiconductor layer and a second electrode layer on the second conductive type semiconductor layer.

18. The light emitting device of claim 13,
    wherein each of the first GaN-based semiconductor layer, the second GaN-based semiconductor layer, and the third GaN-based semiconductor layer has a thickness of about 40 nm to about 60 nm, and wherein each of the first GaN-based semiconductor layer, the second GaN-based semiconductor layer, and the third GaN-based semiconductor layer has a width of about 40 nm to about 50 gm.

19. A light emitting device, comprising:

a reflective layer comprising a first GaN-based semiconductor layer having a first refractive index, a second GaN-based semiconductor layer having a second refractive index less than the first refractive index, and a third GaN-based semiconductor layer having a third refractive index less than the second refractive index; and a light emitting structure layer comprising a first conductive type semiconductor layer, a second conductive type semiconductor layer, and an active layer disposed between the first conductive type semiconductor layer and the second conductive type semiconductor layer on the reflective layer, wherein the first GaN-based semiconductor layer and the second GaN-based semiconductor layer are alternately stacked in a vertical direction in a first region of the reflective layer, and the second GaN-based semiconductor layer and the third GaN-based semiconductor layer are alternately stacked in the vertical direction in a second region of the reflective layer, and wherein the first GaN-based semiconductor layer and the second GaN-based semiconductor layer are alternately disposed in a horizontal direction in a third region of the reflective layer, and the second GaN-based semiconductor layer and the third GaN-based semiconductor layer are alternately disposed horizontally in a fourth region of the reflective layer.

20. The light emitting device of claim 19, wherein the first GaN-based semiconductor layer and the second GaN-based semiconductor layer are horizontally disposed in a lattice shape, and the second GaN-based semiconductor layer and the third GaN-based semiconductor layer are horizontally disposed in the lattice shape.

* * * * *